United States Patent [19]

Iesaka

[11] 4,456,920
[45] Jun. 26, 1984

[54] SEMICONDUCTOR DEVICE

[75] Inventor: Susumu Iesaka, Tokyo, Japan

[73] Assignee: Tokyo Shibaura Denki Kabushiki Kaisha, Kawasaki, Japan

[21] Appl. No.: 194,812

[22] Filed: Oct. 7, 1980

[30] Foreign Application Priority Data

Oct. 18, 1979 [JP] Japan .................. 54-134390

[51] Int. Cl.³ .................................. H01L 27/02
[52] U.S. Cl. ........................ 357/46; 357/52; 357/51; 357/55; 357/86
[58] Field of Search .............. 357/46, 52, 51, 55, 357/86

[56] References Cited

U.S. PATENT DOCUMENTS 4,136,355  1/1979  Mizukoshi et al. .......... 357/46
4,293,868  10/1981  Iizuka et al. ................ 357/46

Primary Examiner—Edward J. Wojciechowicz
Attorney, Agent, or Firm—Finnegan, Henderson, Farabow, Garrett & Dunner

[57] ABSTRACT

A semiconductor device including at least first and second transistors having their respective emitter regions of a first conductivity type formed in a common base layer of a second conductivity type, the semiconductor device comprising a first electrode formed on the emitter region of the first transistor, the first electrode extending on that portion of the base layer which surrounds the emitter region of the second transistor, a second electrode formed on the base layer at the opposite side of the emitter region of the first transistor to that side of the base layer where the second transistor is formed, a first semiconductor region formed in the emitter region of the second transistor, the first semiconductor region having the second conductivity type and extending from the major surface of the emitter region of the second transistor to the base layer, an insulation film formed on the first semiconductor region, a portion of the first semiconductor region being left uncovered with the insulation film, a second semiconductor region formed in the first semiconductor region, the second semiconductor region having the first conductivity type and extending from the surface of the emitter region of the second transistor to the base layer, and a third electrode formed on the emitter region of the second transistor and the first semiconductor region.

10 Claims, 11 Drawing Figures

F I G. 4
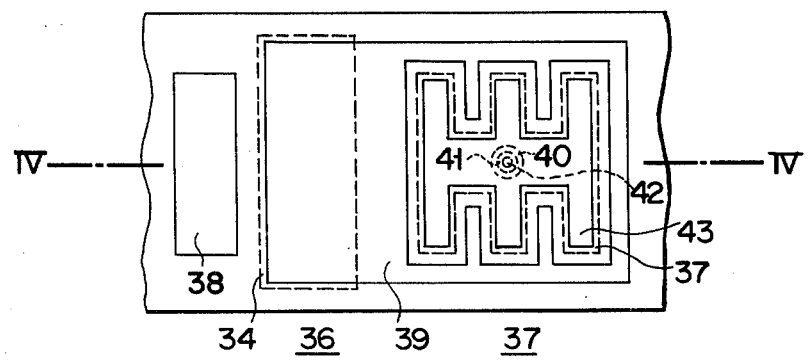
F I G. 5
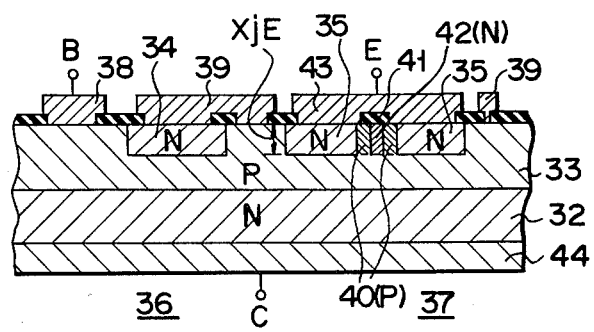
F I G. 6    F I G. 7    F I G. 8
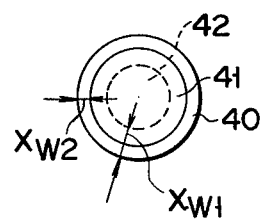 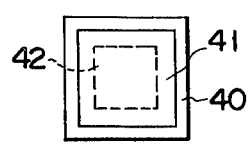 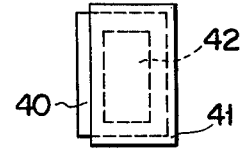

SEMICONDUCTOR DEVICE

This invention relates to a semiconductor device of shorted-emitter structure.

In a monolithic Darlington-connected transistor circuit obtained by Darlington connection of two transistors, each transistor is shorted between its emitter and base regions in order to prevent an increase of collector-emitter current $I_{CEO}$ at high temperature. Such structure is generally called a shorted-emitter structure.

FIG. 1 is a sectional view showing the structure of a prior art monolithic Darlington transistor circuit having the shorted-emitter structure.

In FIG. 1, an N-type semiconductor substrate 11, a P-type semiconductor layer 12, and N-type semiconductor region 13 constitute a first NPN-type transistor 14. Also, the N substrate 11, the P semiconductor layer 12, and an N-type semiconductor region 15 constitute a second NPN-type transistor 16.

In the N region 15 to serve as the emitter region of the second transistor 16, there is formed a P semiconductor region 17 which extends from the exposed major surface of the N region 15 to the P semiconductor layer 12 to serve as the base region. An emitter electrode 18 is formed on the N region 15 and the P region 17. A base electrode 19a of the transistor 14 and a base electrode 19b of the transistor 16 are disposed on the P semiconductor layer 12. A collector electrode 20 is formed on the substrate 11.

FIG. 2 shows an equivalent circuit of the semiconductor device of FIG. 1, in which a resistor 21 connected between the base and emitter of the transistor 14 and a resistor 22 connected between the base and emitter of the transistor 16 are sheet resistors in the semiconductor layer 12. A diode 23 is equivalently formed between the collector and emitter of the transistor 16 since the semiconductor region 17 and emitter region 15 are covered with the emitter electrode 18 to provide a shorted-emitter configuration in the structure.

FIG. 3 shows a motor drive circuit for driving a DC motor incorporating four such Darlington transistor circuits as shown in FIGS. 1 and 2. In this example, the diode 23 in the equivalent circuit shown in FIG. 2 functions as a free-wheeling diode.

In FIG. 3, Q1 to Q4 are Darlington transistor circuits, d1 to d4 are diodes equivalently formed between the collectors and emitters of the second transistors of The Darlington transistor circuits Q1 to Q4, respectively, D1 to D4 are external free-wheeling diodes (fast recovery diodes, generally) connected in parallel with the diodes d1 to d4, respectively, M is a DC motor, and L is an exciting winding.

The rotation of the motor M is controlled by suitably setting the respective switching times of the transistor circuits Q1 to Q4 and the phases among the switching operations of the transistor circuit Q1 to Q4.

In a forward state, for example, the transistor circuits Q1 and Q4 are both switched on when a current I1 flows in the direction of a solid-line arrow in FIG. 3. When one of the transistor circuits Q1 and Q4 is off, currents I2 and I3 flow in the directions of broken-line arrows.

Now let it be supposed that the transistor circuits Q1 and Q4 are both on and the motor M is rotating in the forward direction. Subsequently, when the transistor circuit Q1 is switched off while the circuit Q4 is kept on, a current flows through the transistor circuit Q4, diode d2 and free-wheeling diode D2. Thereafter, when the transistor circuit Q1 is switched on again, a current starts to flow through the transistor circuit Q1. The current starting to flow directly after the transistor circuit Q1 is switched on does not flow into the exciting coil L, but flows through the diodes d2 and D2 as a reverse recovery current. Thus, most of DC source voltage is applied to the transistor circuit Q1 until the diodes d2 and D2 are recovered, so that a great current will flow through the transistor circuit Q1. In this case, if the recovery times of the diodes d2 and D2 are too long, the transistor circuit Q1 will possibly be destroyed.

For the external diodes D1 to D4, there are generally used fast recovery diodes whose recovery time is quite short. The diodes d1 to d4 are so designed as to prolong the lifetime of their carriers for the improvement of the collector-emitter saturation voltage $V_{CE(sat)}$ of transistors in the transistor circuits Q1 to Q4 and higher current gain per pellet area. As compared with the external diodes D1 to D4, therefore, the diodes d1 to d4 require longer recovery time under the same conditions including the area and reverse current value. Thus, when the reverse recovery current flows through the diodes d2 and D2, the diode D2 will be recovered first, so that a great current thereafter flows through the diode d2, leading to breakdown of the transistor circuit Q1.

It is generally known that the recovery time of a diode is shortened as the reverse recovery current density increases. Accordingly, the reverse recovery time can be shortened by substantially reducing the area of the diodes d1 to d4.

To avoid breakdown which may also be caused by heat, however, the diodes d1 to d4 need to have a configuration capable of high radiation efficiency. Moreover, the diodes must provide a proper base-emitter resistance value which is required for the shorted-emitter structure.

This invention is developed in consideration of the aforementioned circumstances, and is intended to provide a semiconductor device including at least two emitter regions formed in a common base region to form at least two transistors, in which the reverse recovery time of a diode equivalently formed in the second transistor is shortened and the radiation efficiency is improved.

According to this invention, there is provided a semiconductor device including at least first and second transistors having their respective emitter regions of a first conductivity type formed in a common base layer of a second conductivity type, the semiconductor device comprising a first electrode formed on the emitter region of the first transistor, the first electrode extending on that portion of the base layer which surrounds the emitter region of the second transistor, a second electrode formed on the base layer at the opposite side of the emitter region of the first transistor to that side of the base layer where the second transistor is formed, a first semiconductor region formed in the emitter region of the second transistor, the first semiconductor region having the second conductivity type and extending from the major surface of the emitter region of the second transistor to the base layer, an insulation film formed on the first semiconductor region, a portion of the first semiconductor region being left uncovered with the insulation film, and a third electrode formed on the emitter region of the second transistor and the first semiconductor region.

This invention can be more fully understood from the following detailed description when taken in conjunction with the accompanying drawings, in which:

FIG. 4 is a plan view of a semiconductor device accordng to an embodiment of the invention;

FIG. 5 is a sectional view of the semiconductor device as taken along line IV—IV of FIG. 4;

FIG. 6 is an enlarged view chiefly showing a P region 40 in the semiconductor device of FIGS. 4 and 5;

FIGS. 7 and 8 show alternative configurations of the P region 40 and other regions related thereto as shown in FIG. 6;

Figure 1:
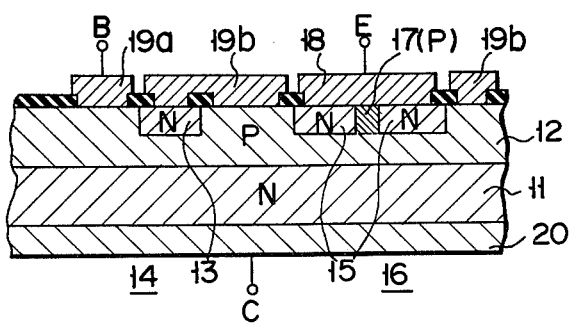
FIG. 1 is a sectional view of a prior art semiconductor device of shorted-emitter structure.
Figure 2:
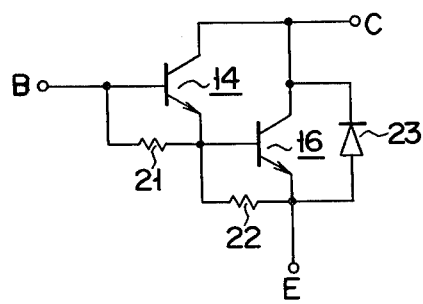
FIG. 2 is an equivalent circuit diagram of the semiconductor device shown in FIG. 1.
Figure 3:
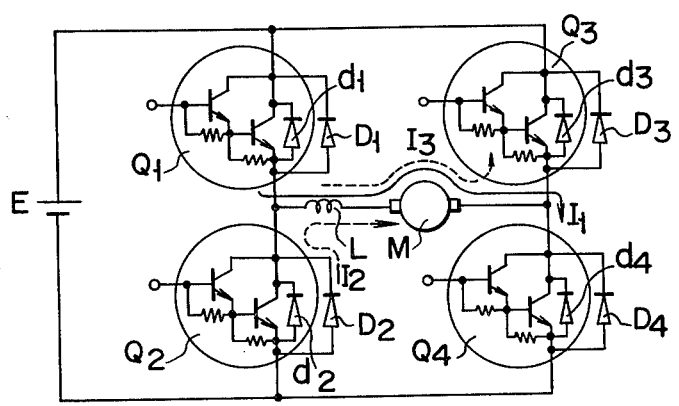
FIG. 3 shows a motor drive circuit using the semiconductor device shown in FIGS. 1 and 2.

A P-type semiconductor layer 33 is formed on an N-type semiconductor layer 32, and an N-type region 34 is formed on the P-type layer 33.

An NPN transistor 36 is formed of the N substrate 32 as its collector region, the P layer 33 as its common base region, and the N region 34 as its emitter region. Also, an NPN transistor 37 is formed of the N substrate 32 as its collector region, the P layer 33 as its common base region, and an N region 35 as its emitter region. A base electrode 38 is formed on the P base layer 33 on the opposite side of the N emitter region 34 to that side where the transistor 37 is formed. An emitter electrode 39 of the transistor 36 is formed on the N emitter Region 34 of the transistor 36, extending on that portion of the P base layer 33 which surrounds the N emitter region 35 and functions also as a base electrode.

Formed in the N emitter region 35 of the second transistor 37 is a P region 40 having a circular geometrical section and extending from the exposed major surface of the emitter region 35 to the P base layer 33. An insulation film 41 of, e.g., SiO₂ is formed on the P region 40, with the continuous circumferential portion of the P region 40 left uncovered with the film 41, that is, with an annular portion left.

Formed in the P region 40 under the insulation film 41 is an N region 42 extending from the major surface of the emitter region 35. An emitter electrode 43 of the transistor 37 is formed on the annular portion of the P region 40 which is not covered with the insulation film 41, as well as on the N emitter region 35. Further, a common collector electrode 44 for the first and second transistors 36 and 37 is formed on the N substrate 32.

FIG. 6 is an enlarged view of the configuration of the P region 40 and other regions in the vicinity thereof in the semiconductor device shown in FIGS. 4 and 5. With such configuration, a diode equivalently connected between the collector and emitter of the second transistor 37 is formed on a portion of the P base layer 33 right under and near the annular portion of the P region 40 which is not covered with the insulation film 41, as its anode region, and a portion of the N collector region (substrate) 32 corresponding thereto, as its cathode region. Accordingly, the area of the diode thus formed can be significantly reduced, as compared with the area of the prior art diode which is obtained by forming the P region 17 in the N emitter region 15, as shown in FIG. 1. Thus, the diode can have its reverse recovery time reduced. Since the anode region of the diode has a narrow annular geometry, current is not concentrated and flows uniformly or dispersively, thereby ensuring extremely high radiation efficiency.

In order to obtain the aforementioned effect with the highest efficiency, from a technological point of view, it is to be desired that the width $X_{W1}$ (see FIG. 6) of the annular geometrical portion of the P region 40 should be about 3 to 6 times as great as the depth $X_{jE}$ (see FIG. 5) of the N emitter region 35 of the second transistor 37 and that the width $X_{W2}$ (see FIG. 6) of the annular geometrical portion of the P region 40 which is not covered with the insulation film 41 should be a little smaller than the width $X_{W1}$, about 2.5 to 5.5 times as great as the depth $X_{jE}$ (see FIG. 5) of the N emitter region 35 of the second transistor 37.

Although the P region 40 has an annular exposed geometry in the above-mentioned embodiment, it is not limited to such configuration and may alternatively be in the shape of e.g. a continuous square ring, as shown in FIG. 7. In this case, the geometrical configuration of the insulation film 41 is also square, and the exposed surface of the P region 40 which is not covered with the insulation film 41 is square-ring-shaped.

Further, as shown in FIG. 8, the exposed geometry of the P region 40 may be formed linear by putting the insulation film 41 on the P region 40 with a square geometry so that only one side edge portion of the P region 40 may be left uncovered.

Figure 9:
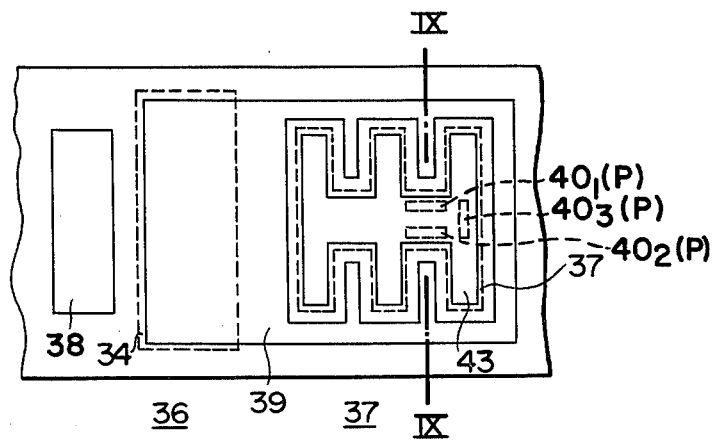
FIG. 9 is a plan view of a semiconductor device according to another embodiment of the invention.

Although only a single P region 40 is used in the embodiment shown in FIGS. 4 and 5, this invention is not limited to such configuration, and the structure of the invention may include a plurality of such P regions, e.g. three P regions $40_1$, $40_2$ and $40_3$, as shown in FIG. 9. In this case, these P regions can be regarded as equivalent to three diodes connected in parallel between the collector and emitter of the second transistor.

Figure 10:
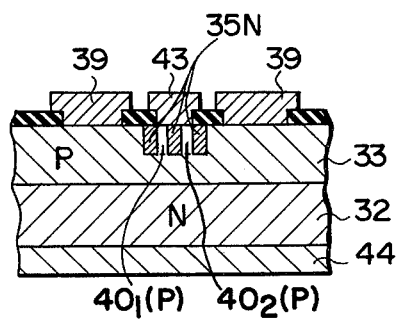
FIG. 10 is a sectional view of the semiconductor device as taken along line IX—IX of FIG. 9.

FIG. 10 is a sectional view of the semiconductor device as taken along line IX—IX of FIG. 9. In the embodiment shown in FIGS. 9 and 10, like reference numerals are used to designate the same portions as those of the embodiment shown in FIGS. 4 and 5, and description of such portions will be omitted. In this second embodiment, the insulation film 41 as in FIGS. 4 and 5 is not formed. Also with this embodiment of FIGS. 9 and 10, there may be obtained the same effect of the embodiment described in connection with FIGS. 4 and 5.

Figure 11:
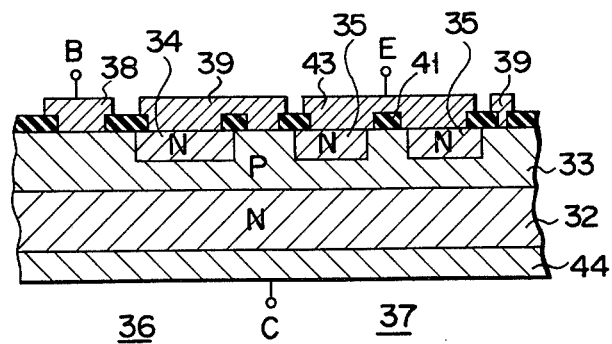
FIG. 11 shows a semiconductor device according to still another embodiment of the invention.

FIG. 11 shows still another embodiment of this invention. Also in this embodiment, like reference numerals are used to designate the same portions as those of the embodiment of FIG. 4, and detailed description of such portions will be omitted.

In this embodiment, the N region 42 provided in the embodiment of FIG. 5 is not formed under the insulation film 41. Namely, only the P region 40 is formed in the N emitter region 35. As compared with the embodiment shown in FIGS. 4 and 5, the semiconductor device according to the embodiment of FIG. 11 is easier to manufacture. Although the reverse recovery time is somewhat prolonged with use of this embodiment, as compared with the embodiments of FIGS. 4 and 5, it still is considerably shorter than the reverse recovery time required by the prior art device.

Also in the case of this embodiment, the exposed portion of the P region 40 may have various geometrical configurations, such as the ones shown in FIGS. 6, 7 and 8. Moreover, a plurality of the P regions 40 may be formed to provide a plurality of equivalent diodes, as in the embodiment shown in FIGS. 9 and 10.

According to this invention, as described above, there may be provided a semiconductor device including at least two emitter regions formed in a common base region to form at least two transistors, in which the reverse recovery time of a diode equivalently formed on the second transistor is shortened and the radiation efficiency is improved.

What is claimed is:

1. In a semiconductor device in which an input stage transistor has a first emitter region and an output stage transistor has a second emitter region, said emitter regions being of a first conductivity type and being formed in adjacent portions of a common base layer of a second conductivity type, and in which a substrate layer of said first conductivity type is contiguous with said common base layer and is provided, on a side opposite said common base layer, with an electrode common to both said input and output stage transistors, the combination comprising:

a first electrode contacting said first emitter region and surrounding said second emitter region;

a second electrode contacting said base layer on a surface thereof adjacent said first emitter region and on a side of said first region away from said second emitter region;

a third electrode contacting said second emitter region;

a first semiconductor region of said second conductivity type formed within and surrounded by said second emitter region and extending along a line perpendicular to the plane of said common base layer through the depth of said second emitter region whereby a portion of said third electrode is separated from said substrate layer by a continuous region of said second conductivity type; and a second semiconductor region of said first conductivity type formed within and surrounded by said first semiconductor region.

2. A semiconductor device according to claim 1, wherein said first semiconductor region is annular in shape.

3. A semiconductor device according to claim 2, wherein the annulus width of said first semiconductor region is about 3 to 6 times as great as the depth of said second emitter region.

4. A semiconductor device according to claim 1, wherein said first semiconductor region is configured as a square in the plane of said base layer.

5. A semiconductor device according to claim 1 further comprising a third semiconductor region of said second conductivity type formed within and surrounded by said second emitter region and extending through the depth of said region whereby plural portions of said third electrode are separated from said substrate layer by continuous regions of said second conductivity type.

6. A semiconductor device according to claim 1, further including an insulation film separating a portion of said first semiconductor region and all of said second semiconductor region from said third electrode.

7. A semiconductor device according to claim 6, wherein the portion of said first semiconductor region not separated from said third electrode by said insulation film is rectangularly shaped in the plane of said base layer.

8. A semiconductor device according to claim 6, wherein the portion of said first semiconductor region not separated from said third electrode by said insulation film is shaped as a hollow rectangle in the plane of said base layer.

9. A semiconductor device according to claim 6, wherein the portion of said first semiconductor region not separated from said third electrode by said insulation film is annularly shaped in the plane of said base layer.

10. A semiconductor device according to claim 6, wherein the width of said portion of the first semiconductor region not separated from said third electrode by said insulation film is about 2.5 to 5.5 times as great as the depth of said second emitter region.

* * * * *